(12) United States Patent
Akasaka

(10) Patent No.: US 6,544,044 B2
(45) Date of Patent: Apr. 8, 2003

(54) SOCKET FOR BGA PACKAGE

(75) Inventor: Junya Akasaka, Kanagawa (JP)

(73) Assignee: Tyco Electronics, AMP, K.K. (JP)

(*) Notice: Subject to any disclaimer, the term of this patent is extended or adjusted under 35 U.S.C. 154(b) by 0 days.

(21) Appl. No.: 09/921,804

(22) Filed: Aug. 3, 2001

(65) Prior Publication Data

US 2002/0022386 A1 Feb. 21, 2002

(30) Foreign Application Priority Data

Aug. 10, 2000 (JP) ..................................... 2000-242050

(51) Int. Cl.[7] ............................................. H01R 12/00
(52) U.S. Cl. .......................................... 439/71; 439/66
(58) Field of Search ............................. 439/70, 71, 66

(56) References Cited

U.S. PATENT DOCUMENTS

| | | | | |
|---|---|---|---|---|
| 5,374,197 A | * | 12/1994 | Uratsuji | 439/71 |
| 5,493,237 A | * | 2/1996 | Volz et al. | 324/754 |
| 5,688,127 A | * | 11/1997 | Staab et al. | 439/66 |
| 6,027,355 A | * | 2/2000 | Ikeya | 439/268 |
| 6,094,057 A | * | 7/2000 | Hiruta et al. | 324/755 |
| 6,152,744 A | * | 11/2000 | Maeda | 439/71 |

* cited by examiner

Primary Examiner—Tho D. Ta
Assistant Examiner—Truc Nguyen
(74) Attorney, Agent, or Firm—Barley, Snyder, Senft & Cohen; Michael J. Aronoff

(57) ABSTRACT

The present invention relates to a BGA package IC socket that accommodates a BGA (ball grid array) package such that the BGA package IC socket has high reliability and can withstand long-term use. The socket is equipped with package receiving members 140. Package receiving parts 141 of members 140 receive the portions of the BGA package 10 located in the vicinity of the opposite edges of the undersurface of the BGA package 10. The parts 141 pivot downward with the insertion of the BGA package 10. The parts 141 have a shaft which are supported on the housing so that the package receiving members 140 are free to pivot. Springs 150 cooperate with the members 140, such that the springs 150 resist the insertion of the BGA package into the socket.

7 Claims, 6 Drawing Sheets

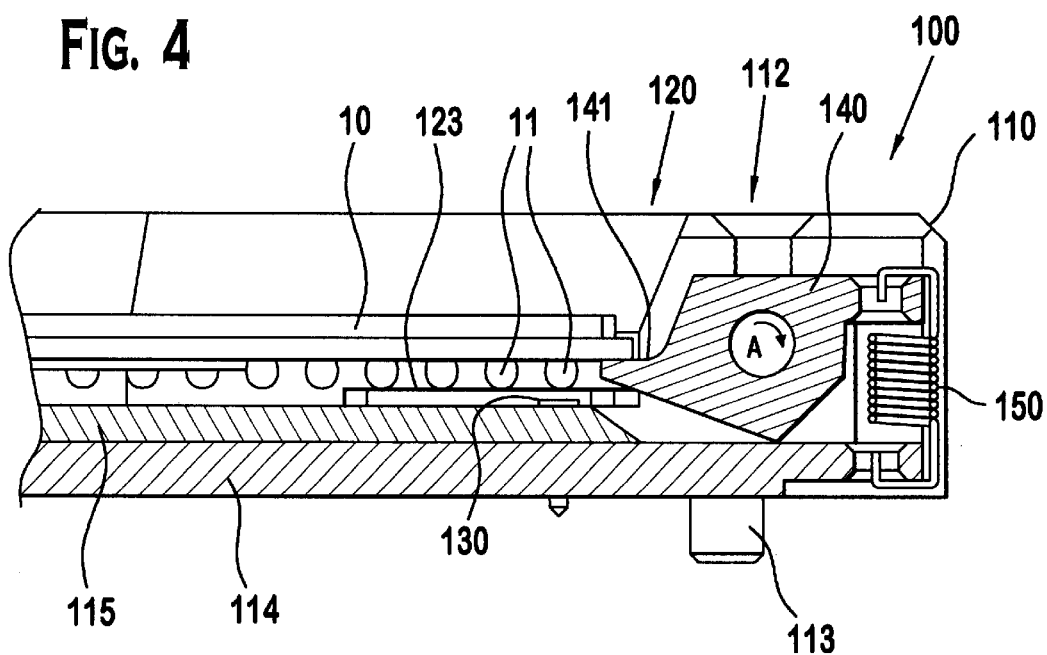
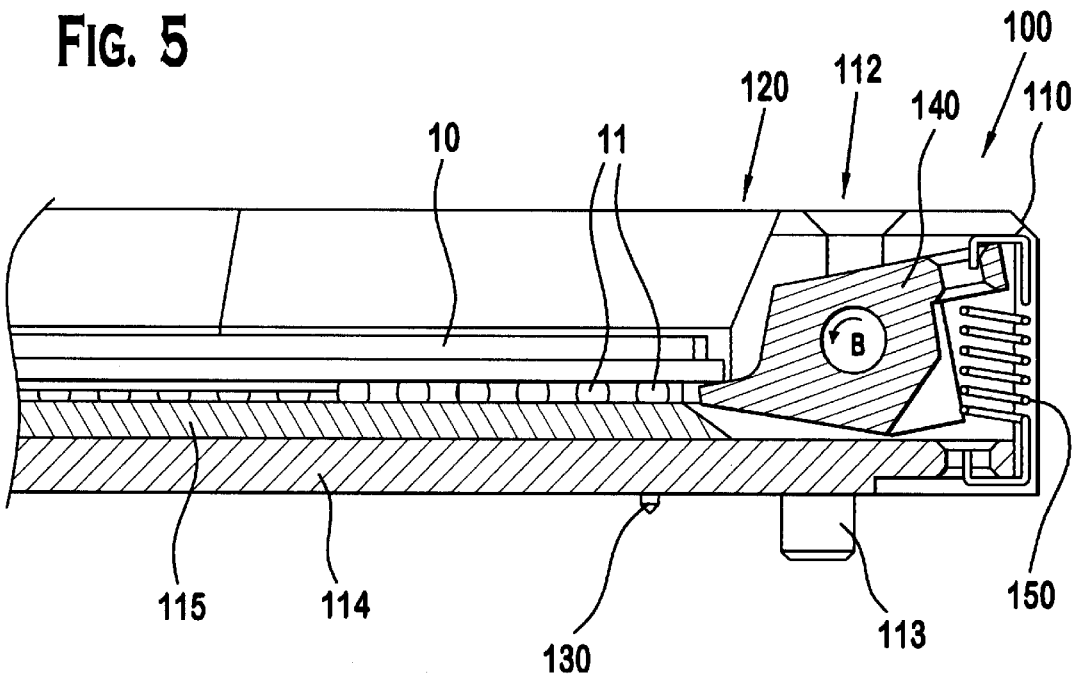

SOCKET FOR BGA PACKAGE

FIELD OF THE INVENTION

The present invention relates to an IC socket which accommodates a BGA (ball grid array) package.

BACKGROUND OF THE INVENTION

Conventionally, BGA packages in which a plurality of electrodes consisting of solder balls are lined up on the undersurface of the package have been used in order to facilitate soldering to a circuit board. When such BGA packages are used, soldering can be completed by placing the BGA package on the surface of the circuit board and heating the package.

In order to test the functions of ICs mounted on such BGA packages prior to final assembly, it is necessary to align the solder balls on the undersurface of the BGA and maintain the package in this state as testing occurs. Conventionally, IC sockets for BGA packages have been used for this purpose. FIG. 7 is a diagram which shows the schematic construction and problem points of a conventional IC socket for a BGA package.

As is shown in FIG. 7(A), numerous solder balls 11 are lined up on the undersurface of the BGA package 10. This BGA package 10 is placed on a package accommodating plate 20 (shown in FIG. 7(B)) which forms an IC socket that accommodates the BGA package 10. Solder ball receiving holes 21 are formed in this package accommodating plate 20 in positions corresponding to the solder balls 11 on the undersurface of the BGA package 10. As is shown in FIG. 7 (C), the BGA package 10 is placed on the package accommodating plate 20 so that the solder balls 11 on the undersurface of the BGA package 10 enter the solder ball receiving holes 21. The package accommodating plate 20 is driven upward relative to the IC socket main body (not shown in the figures) by means of coil springs 22. These coil springs 22 are compressed as a result of the BGA package 10 being pressed from above, so that the solder balls 11 contact pins (not shown in the figures) that are lined up on the IC socket main body. The pins that are lined up on the IC socket main body are also spring-driven upward. When the BGA package 10 is pushed from above, these pins are pressed by the solder balls 11 on the undersurface [of the BGA packaged 10], so that the pins move somewhat in the sinking direction. Thus, the solder balls 11 securely contact the pins, so that electrical continuity is established between the solder balls and pins, and therefore between the IC inside the BGA package and the test apparatus, thus allowing operational testing of the IC inside the BGA package to be performed.

When the BGA package 10 is placed on the package accommodating plate 20, the solder balls 11 inevitably tend to contact the edges of the solder ball receiving holes 21, so that small portions of the solder balls are scraped away during each testing cycle. Consequently, as is shown in FIG. 7(D), the solder debris 11' created by this scraping accumulates at the edges of the solder ball receiving holes 21, thus impeding the mounting of the BGA package. This solder debris 11' may also fall toward the IC socket main body, so that there is a danger that the movement of the pins will be hindered, thus reducing the long-term reliability of the IC socket.

In light of the above facts, it would be desirable to provide an IC socket for a BGA package which has high reliability and can withstand long-term use.

SUMMARY OF THE INVENTION

The IC socket for a BGA package provided by the present invention, which achieves the above-mentioned object. The IC socket accommodates a BGA package which has a plurality of electrodes consisting of solder balls lined up on its undersurface. The socket has a housing in which an accommodating part that accommodates the BGA package from above is formed. Electrode pins are lined up in the bottom portion of the above-mentioned accommodating part, such that the electrode pins contact the solder balls on the undersurface of the accommodated BGA package. Package receiving members are disposed so that these members protrude into the above-mentioned accommodating part from both sides of the accommodating part. The package receiving members have package receiving parts that receive the portions of the BGA package located in the vicinity of the opposite edges of the undersurface of the BGA package and pivot downward with the accommodating movement of the BGA package. The members are shaft-supported on the above-mentioned housing so that these package receiving members are free to pivot, and are spring-driven in the direction that lifts the BGA package received by the above-mentioned package receiving parts.

In the case of the IC socket for a BGA package that is provided by the present invention, only the electrode pins contact the solder balls. Accordingly, the chance of the solder balls being scraped is greatly reduced, so that high reliability is maintained even in the case of long-term use.

BRIEF DESCRIPTION OF THE DRAWINGS

FIG. 4 is a diagram showing a state in which the BGA package has just contacted the package receiving parts of the package receiving members while in the process of being accommodated in the accommodating part.

FIG. 5 shows a state in which the BGA package has been pushed further downward from the state shown in FIG. 4, so that the BGA package is completely accommodated in the accommodating part.

DETAILED DESCRIPTION OF THE DRAWINGS

Figure 1:
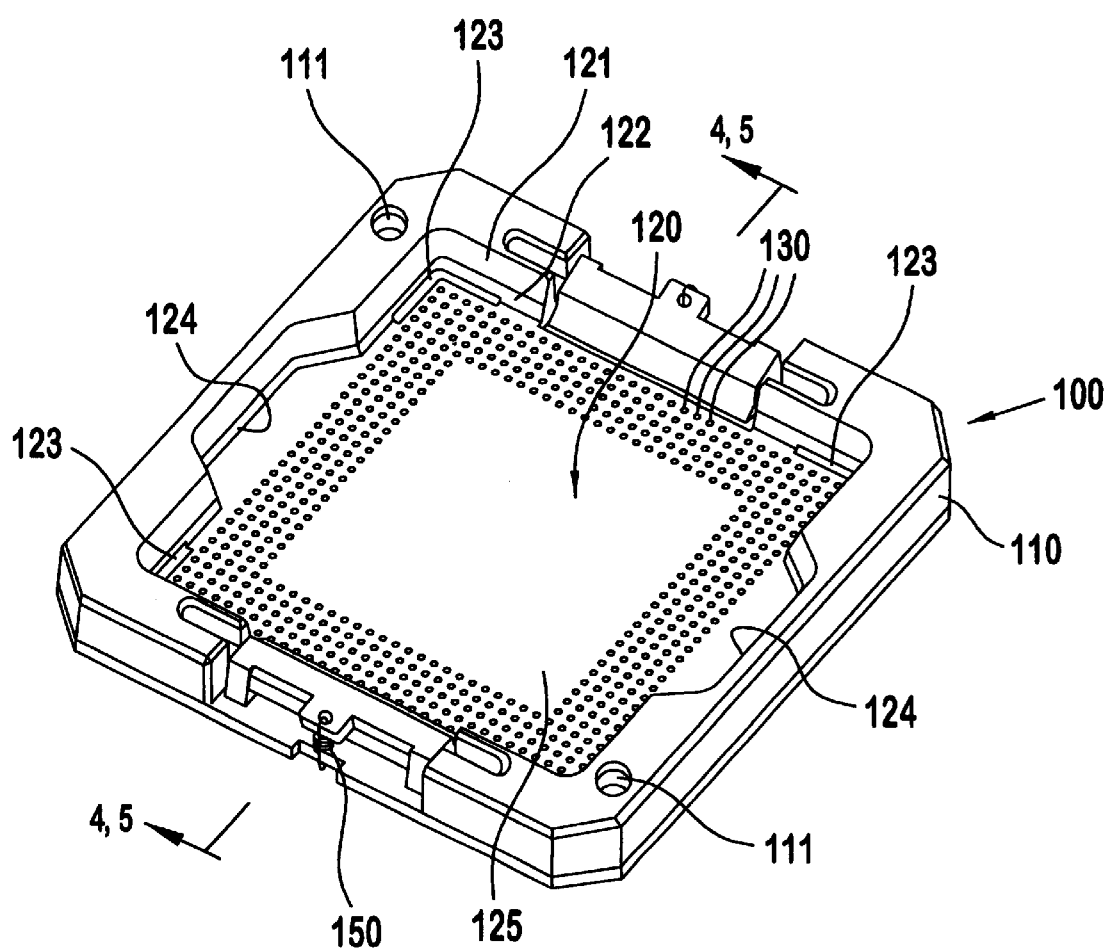
FIG. 1 is a perspective view of the BGA package IC socket of the present invention.
Figure 2:
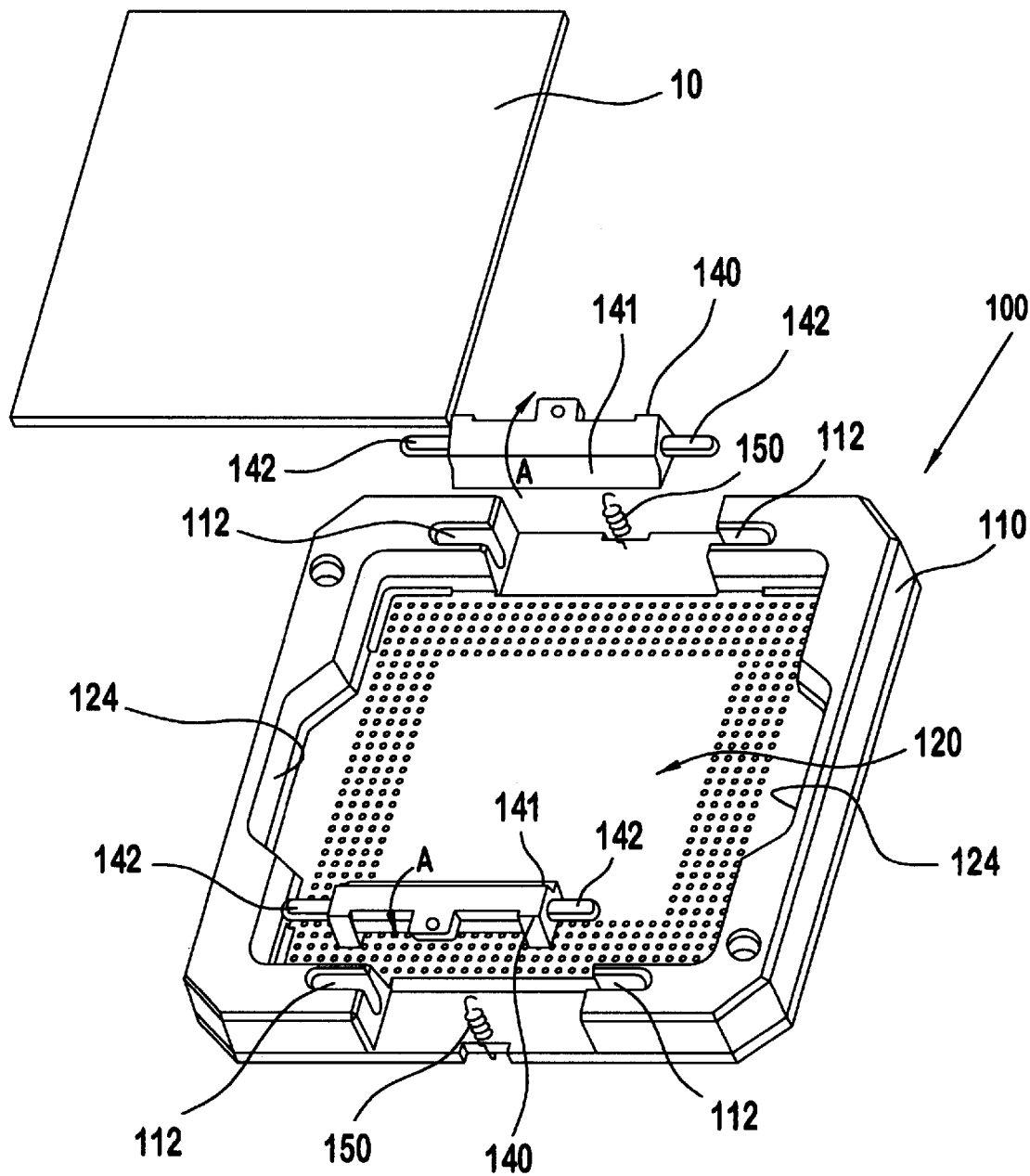
FIG. 2 is an exploded perspective view of the IC socket shown in FIG. 1.

FIG. 1 is a perspective view of one working configuration of the IC socket for a BGA package provided by the present invention. FIG. 2 is an exploded perspective view of the IC socket shown in FIG. 1. In FIG. 2, the BGA package 10 is also shown as a plate in model form.

The BGA package IC socket 100 shown in FIGS. 1 and 2 has a housing 110. An accommodating recess 120 which accommodates the BGA package 10 from above is formed in the center of the housing 110. Upper parts 121 of the wall surfaces surrounding this accommodating recess 120 are formed with a taper. The BGA package 10 is guided by this taper so that the BGA package 10 is more easily accommodated in the accommodating recess 120. The lower parts 122 of the surrounding wall surfaces of the accommodating recess 120 are formed in a vertical attitude; as a result, the BGA package 10 accommodated in the accommodating recess 120 is securely positioned. Stands 123 are formed in the corners of the accommodating recess 120 and cooperate with the corner parts of the undersurface of the BGA package 10. The lower-limit position of the BGA package 10 in the accommodating recess 120 is determined by these stands 123.

Numerous electrode pins 130 are lined up in the lower portion of the accommodating recess 120. These pins 130 are respectively disposed in positions corresponding to the solder balls 11 on the undersurface of the BGA package 10, so that when the BGA package 10 is positioned in the accommodating recess 120, each of the solder balls 11 on the undersurface of the BGA package 10 is aligned with a respective electrode pin 130.

Positioning holes 111 are formed in the housing 110. The positioning holes 111 are used to position the BGA package IC socket 100 relative to the test apparatus (not shown in the figures) that tests the IC inside the BGA package 10.

As is shown in FIG. 2, this BGA package IC socket 100 is equipped with package receiving members 140. The package receiving members 140 has pivoting shafts 142 which are inserted into shaft grooves 112 formed in the housing 110, thereby allowing the members 140 to pivot relative to the housing 110. The package receiving members 140 are spring-driven by coil springs 150 in the direction indicated by the arrows A.

The package receiving members 140 each have a package receiving part 141 that protrudes into the interior of the accommodating recess from the side of the accommodating recess 120. The package receiving parts 141 receive the portions of the BGA package that are located in the vicinity of the edges of the undersurface of the BGA package, and pivot downward with the insertion of the BGA package into the accommodating recess 120. As a result of the action of the coil springs 150, a force which opposes insertion and acts in the lifting direction is applied to the BGA package inserted into the accommodating recess 120.

Side recesses 124 are formed in the opposite sides of the accommodating recess 120 in which no package receiving members 140 are installed. The side recesses 124 facilitate the removal of the BGA package 10 from the IC socket 100.

As the BGA package 10 is inserted in the accommodating recess 120, the BGA package 10 is further pushed from above, so that the solder balls on the undersurface of the BGA package make secure physical and electrical contact with the electrode pins 130 of the IC socket. In this position, an operational test of the IC that is mounted in the BGA package is performed.

FIG. 3 is a model diagram which shows the movement of the BGA package IC socket (shown in FIGS. 1 and 2) that occurs when the BGA package is inserted. FIG. 3(A) shows the BGA package; numerous solder balls are lined up on the undersurface of this BGA package 10. FIGS. 3(B) and 3(C) respectively show the left and right package receiving members 140. The package receiving members 140 are constructed so that they pivot with the pivoting shafts 142 of these package receiving members 140 inserted into the shaft grooves 112 formed in the housing 110 as shown in FIGS. 1 and 2. The package receiving parts 141 are driven by coil springs 150 in the direction that lifts these package receiving parts 141 upward, as viewed in FIG. 3 (D).

Figure 3A:
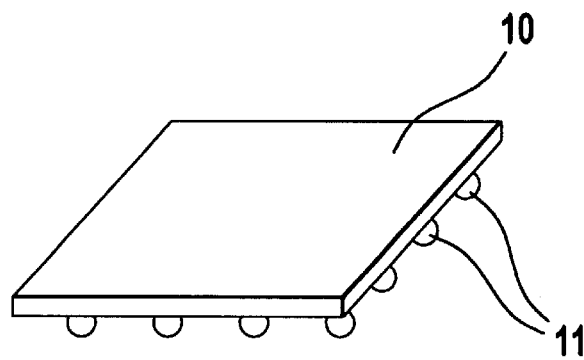
FIG. 3 is a model diagram which shows the movement that occurs when the BGA package IC socket shown in FIGS. 1 and 2 accommodates a BGA package.
Figure 3B:
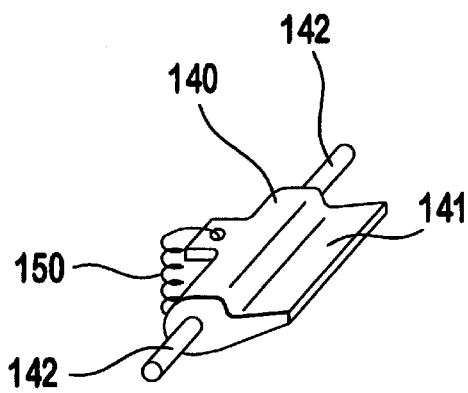
Figure 3C:
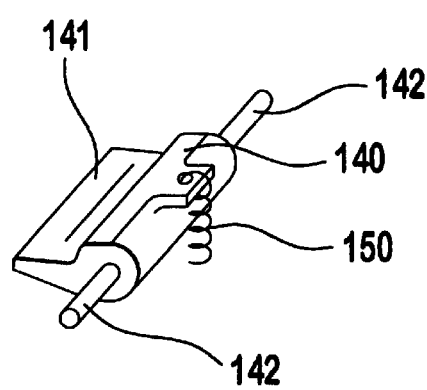
Figure 3D:
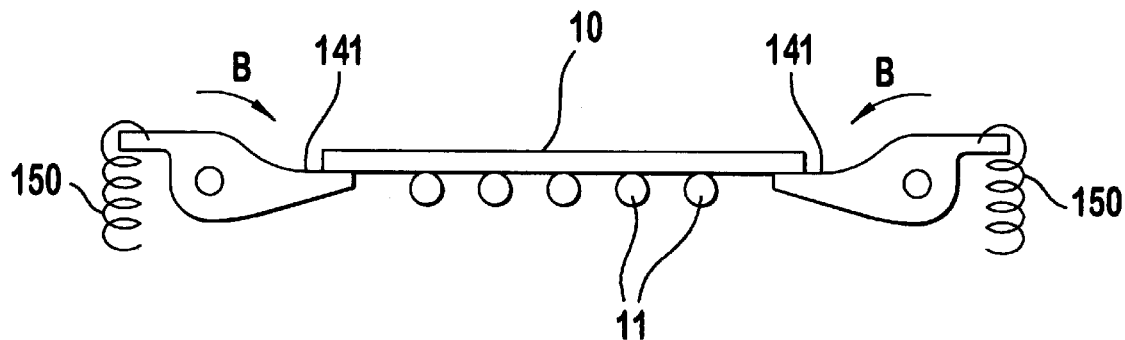

The package receiving parts 141 are disposed so that they protrude into the interior of the accommodating recess from both sides of the accommodating recess 120 (see FIGS. 1 and 2). As is shown in FIG. 3(D), these package receiving parts 141 receive the opposite edge portions of the BGA package 10 that is inserted in this accommodating recess. In accordance with the insertion of the BGA package, these package receiving parts 141 pivot in the direction indicated by the arrows B against the spring-driving force of the coil springs 150.

The package receiving members 140 are parts which have a function similar to that of the package accommodating plate 20 in the conventional example shown in FIG. 7. However, unlike the package accommodating plate 20 in the conventional example, these package receiving members 140 do not contact the solder balls on the undersurface of the BGA package. Accordingly, the danger that the solder balls will be scraped or removed is greatly reduced, so that a high degree of reliability can be maintained over a long period of time.

FIGS. 4 and 5 are partial sectional views along the arrow line 4,5 shown in FIG. 1. FIG. 4 shows a state in which the BGA package 10 has just contacted the package receiving parts 141 of the package receiving members 140 as the package 10 is being inserted into the accommodating recess 120. FIG. 5 shows a state in which the BGA package 10 has been pushed further downward from the state shown in FIG. 4, so that the BGA package 10 is completely inserted in the accommodating recess 120. In FIGS. 4 and 5, only a single electrode pin 130 is shown as a representative; in actuality, however, a number of electrode pins 130 equal to the number of solder balls on the undersurface of the BGA package are lined up as shown in FIGS. 1 and 2.

On the lower part of the housing 110, a projecting part 113 is formed. The projecting part 113 is inserted into a hole formed in the circuit board (not shown in the figures) on which this BGA package IC socket 100 is mounted, so that the BGA package IC socket 100 is positioned relative to this circuit board. Although a single projecting part is shown, multiple projecting parts may be provided. Furthermore, the electrode pins 130 also protrude from the lower part of the housing 110 so that these electrode pins contact the wiring pattern on the circuit board.

The package receiving members 140 are spring-driven by means of coil springs 150 in the direction that lifts the BGA package 10, i.e., in the direction indicated by the arrow A in FIG. 4. In the embodiment shown, the springs 150 are tension springs. However, in the state in which no BGA package 10 is inserted in the accommodating recess 120, the undersurfaces 143 of the package receiving members 140 make surface contact with the bottom surface of the housing 110, thus being restricted so that there is no further pivoting of these members in the direction indicated by the arrow A.

When the BGA package 10 is pushed further downward from the position shown in FIG. 4 to the position shown in FIG. 5, the package receiving members 140 pivot in the direction indicated by the arrow B. As this occurs, the coil springs 150 are slightly extended and the head parts of the electrode pins 130 are pushed downward by the solder balls 11.

In the BGA package 10 shown in the figures, a region which protrudes slightly downward from the undersurface, and in which no solder balls 11 are disposed, is present on the center of the undersurface of the package. As is clear from FIG. 1, no electrode pins 130 are disposed in the region 125 of the accommodating recess 120 that corresponds to this region of the package 10. Package receiving members that are spring-driven upward may also be disposed in the region 125; however, since IC chips and wiring extending from these IC chips to the solder balls 11 are contained in the region of the package 10, it is not desirable that package receiving members contact the region. In this regard, the package receiving members in the present invention receive the portions of the BGA package located in the vicinity of the opposite edges of the undersurface of the BGA package. Accordingly, there is no deleterious effect on the IC chips or wiring. It is worth noting that BGA packages of the type shown in the figures and the type in which solder balls are disposed over the entire undersurface are both contemplated by the present invention.

Figure 6:
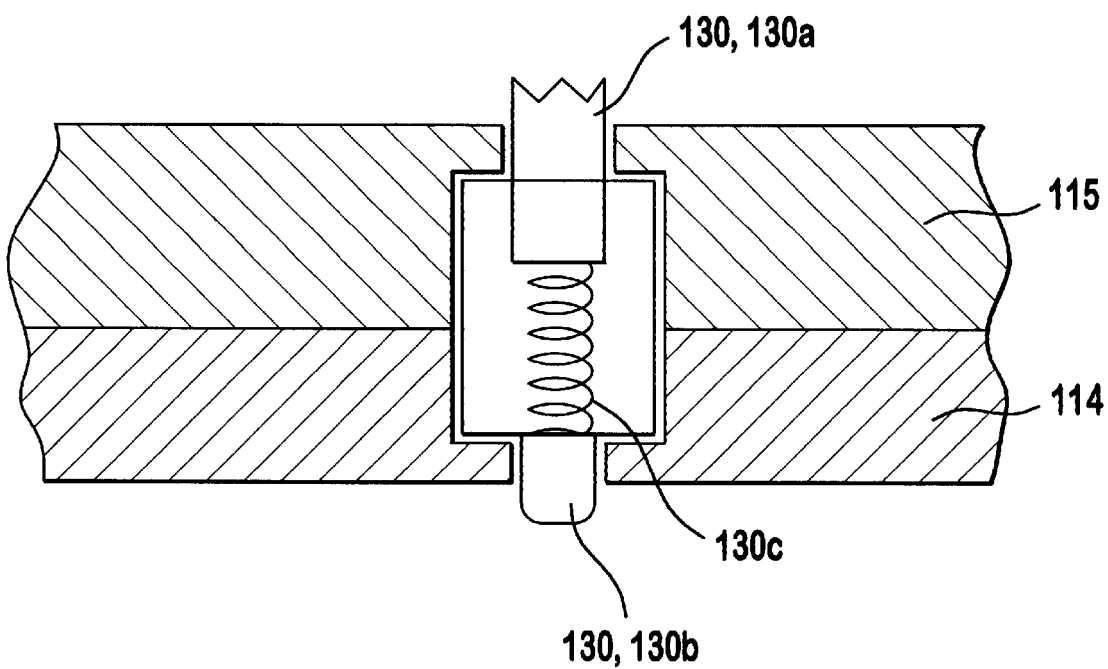
FIG. 6 is a model sectional view which shows the structure of the electrode pins.
Figure 7A:
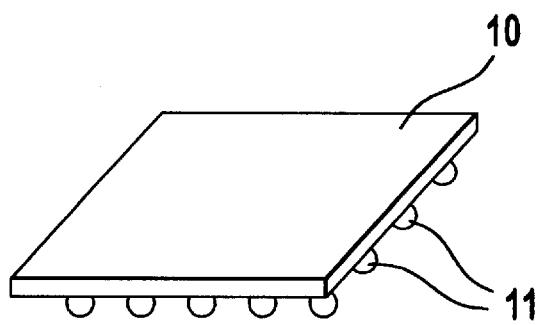
FIG. 7 is a diagram which shows the schematic construction and problem points of a conventional BGA package IC socket.
Figure 7B:
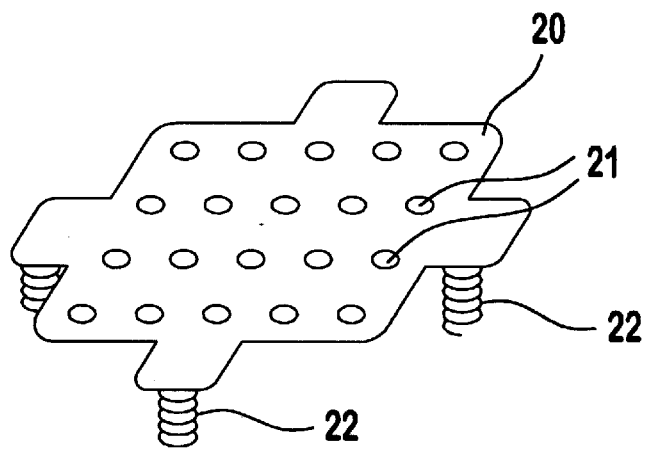
Figure 7C:
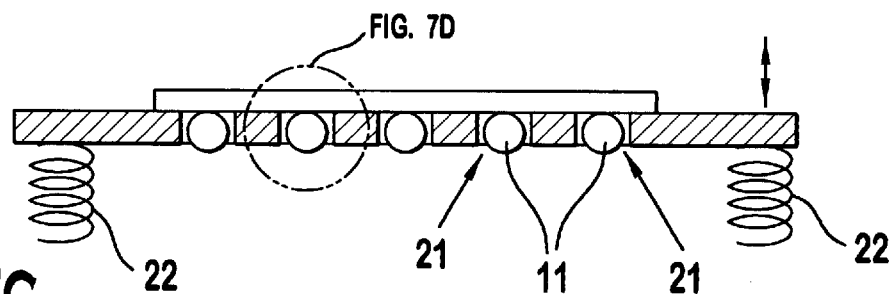
Figure 7D:
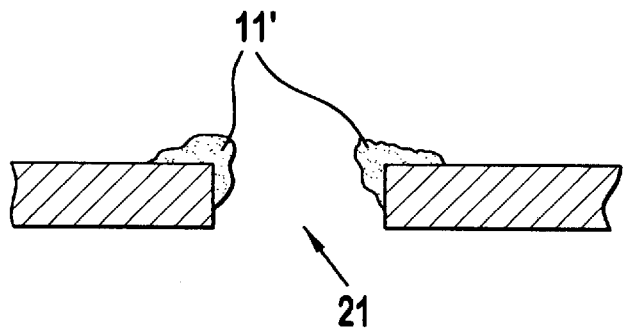

FIG. 6 is a model sectional view which illustrates the structure of the electrode pins 130. As is shown in FIGS. 4 and 5, a first bottom plate 114 and a second bottom plate 115 are superimposed. The lower members 130b that constitute the electrode pins 130 protrude downward from the first bottom plate 114, and the upper parts of the lower members 130b of the electrode pins 130 are formed with a tubular shape. Coil springs 130c are disposed inside these tubular parts, and these coil springs 130c drive the upper members 130a of the electrode pins 130 upward. Furthermore, when these upper members 130a are pressed from above by the solder balls, the coil springs 130c are compressed, so that the solder balls and the upper members 130a of the electrode pins 130 make secure contact.

In the present invention, as described above, only the electrode pins contact the solder balls and the danger of other parts contacting the solder balls is reduced. Accordingly, the danger that the solder balls will be scraped is reduced, so that high reliability can be maintained even in the case of long-term use.

I claim:

1. An IC socket that accommodates a BGA package which has a plurality of solder balls positioned on an undersurface of the BGA package, the socket comprising:

a housing having an accommodating part that accommodates the BGA package, pins which are positioned in a bottom portion of the accommodating part, the pins are configured to contact the solder balls on the undersurface of the accommodated BGA package, and package receiving members which protrude into the accommodating part from opposite sides of the accommodating part, the package receiving members have package receiving parts, which receive the portions of the BGA package located proximate opposite edges of the undersurface of the BGA package, the package receiving members pivot downward with the insertion of the BGA package into the accommodating part, a shaft is provided on each package receiving member, the shaft is supported by the housing so that the package receiving members are free to pivot, and resilient members cooperate with the package receiving members in the direction that lifts the BGA package received by the package receiving parts.

2. The socket as recited in claim 1 wherein the shafts are positioned in shaft grooves formed in the housing, thereby allowing the package receiving members to pivot relative to the housing.

3. The socket as recited in claim 1 wherein the resilient members are coil springs.

4. The socket as recited in claim 3 wherein the coil springs applies a force to the package receiving members which opposes insertion of the BGA package.

5. The socket as recited in claim 1 wherein side recesses 124 are formed in the opposite sides of the accommodating part in which no package receiving members are positioned, the side recesses are provided to facilitate the removal of the BGA package from the IC socket.

6. The socket as recited in claim 1 wherein undersurfaces of the package receiving members engage a bottom surface of the housing to restrict the pivoting of the package receiving members when no BGA package is positioned in the accommodating part.

7. The socket as recited in claim 1 wherein the pins have lower members with a tubular configuration with coil springs disposed therein, whereby when upper members of the pins are pressed from above by the solder balls, the coil springs are compressed, so that the solder balls and the upper members of the electrode pins 130 make a secure contact.

* * * * *